United States Patent
Chiang et al.

(10) Patent No.: US 7,596,047 B2
(45) Date of Patent: Sep. 29, 2009

(54) MEMORY CARD AND CONTROL CHIP CAPABLE OF SUPPORTING VARIOUS VOLTAGE SUPPLIES AND METHOD OF SUPPORTING VOLTAGES THEREOF

(75) Inventors: Chin-Yi Chiang, Taipei (TW); Chien-Zhi Chen, Taipei (TW)

(73) Assignee: Via Technologies, Inc., Taipei (TW)

( * ) Notice: Subject to any disclaimer, the term of this patent is extended or adjusted under 35 U.S.C. 154(b) by 311 days.

(21) Appl. No.: 11/456,235

(22) Filed: Jul. 10, 2006

(65) Prior Publication Data

US 2007/0008801 A1    Jan. 11, 2007

(30) Foreign Application Priority Data

Jul. 11, 2005    (TW) .............................. 94123399 A

(51) Int. Cl.
*G11C 5/14*    (2006.01)
(52) U.S. Cl. .................... 365/226; 365/51; 365/189.09
(58) Field of Classification Search ................. 327/540, 327/541; 365/51, 189.09, 226, 227
See application file for complete search history.

(56) References Cited

U.S. PATENT DOCUMENTS

| 5,289,425 A * | 2/1994 | Horiguchi et al. ........... 365/226 |
| 5,956,270 A * | 9/1999 | Shimomura et al. ..... 365/185.18 |
| 6,826,107 B2 * | 11/2004 | Dvir et al. ................... 365/226 |
| 6,906,582 B2 * | 6/2005 | Kase et al. ................... 327/541 |
| 6,982,919 B2 * | 1/2006 | Kumahara et al. .......... 365/226 |
| 2005/0086413 A1 * | 4/2005 | Lee et al. .................... 710/313 |
| 2005/0141317 A1 * | 6/2005 | Kim et al. ................... 365/226 |

FOREIGN PATENT DOCUMENTS

| CN | 1581357 | 2/2005 |
| TW | 550571 | 9/2003 |
| TW | I235379 | 7/2005 |

* cited by examiner

*Primary Examiner*—Tuan T Nguyen
*Assistant Examiner*—Alexander Sofocleous
(74) *Attorney, Agent, or Firm*—Thomas, Kayden, Horstemeyer & Risley

(57) ABSTRACT

A memory card and a control chip capable of supporting various voltage supplies and a method of supporting voltages are discussed. The memory card includes a flash memory and a control chip for controlling the flash memory, and the control chip has a voltage regulator, a pad power supplier, a core controller and an output circuit. The voltage regulator transforms an external working voltage into a working voltage. The pad power supplier receives the external working voltage and adjusts a level of the external working voltage to output a pad working voltage according to an operating mode. The core controller receives the working voltage to work and generates a control signal. The output circuit receives the control signal and outputs a memory control signal according to a level of the pad working voltage. The control chip controls a flash memory with the memory control signal.

20 Claims, 1 Drawing Sheet

MEMORY CARD AND CONTROL CHIP CAPABLE OF SUPPORTING VARIOUS VOLTAGE SUPPLIES AND METHOD OF SUPPORTING VOLTAGES THEREOF

This application claims the benefit of Taiwan application Serial No. 94123399, filed Jul. 11, 2005, the subject matter of which is incorporated herein by reference.

BACKGROUND OF THE INVENTION

1. Field of the Invention

The invention relates in general to the fields of memory cards, and more particularly to a memory card and a method supporting various voltage supplies.

2. Description of the Related Art

Memory cards have been greatly popularized for large capacity, small size and portability characters thereof. Memory cards are applied in many of electronic devices, providing expanded storage for digital cameras, Personal Digital Assistants (PDAs), MP3 players, etc.

One type of conventional memory card is typically designed to support a single voltage, for example, 3.3 volts. The memory card of this type generally comprises a flash memory storing data and a control chip controlling operations of the flash memory. The control chip is composed of a voltage regulator, a core controller and an output circuit. The core controller is provided for controlling the control chip and operations of other elements in the control chip. The memory card receives an operating voltage supplied from a host. The voltage regulator receives and transforms the operating voltage into a working voltage fed to the core controller. The operating voltage also is fed to the output circuit and the flash memory. The core controller outputs a first control signal to the output circuit, and the output circuit outputs a second control signal to control the flash memory according to the input operating voltage and the first control signal from the core controller.

However, the memory card supporting single power supply may be unintentionally inserted into a computer system that provides a power supply voltages different to the operating voltage, this might cause damages to data store in the memory card and the memory card itself. For solving this problem, another (a second) type of conventional memory cards, which capable of supporting two voltages, are designed. The memory card supporting two voltages is composed of a control chip, a flash memory, an external voltage regulator and an internal voltage regulator disposed on the control chip. The external voltage regulator is provided to transform the operating voltage of, for example, 3.3 or 1.8 volts supplied from the host, into a first working voltage of, for example, 1.8 volts. The first working voltage is supplied to the output circuit, the internal voltage regulator, and the flash memory. The internal voltage regulator further transforms the first working voltage into a second working voltage supplied to the core controller. The output circuit receives the first working voltage and a first control signal from the core controller so as to output a second control signal controlling the flash memory. As the operating voltage from the host is transformed into the first working voltage, which is applicable to the control chip and the flash memory, by the external regulator in advance, the memory card of the this conventional type is capable of supporting two different power supplying. However, the cost of the memory card is increased due to the added external voltage regulator.

For overcome the disadvantage mentioned above, a third type of conventional memory card is provided. Besides the flash memory, the core controller and the output circuit, the memory card of the third type provides only one voltage regulator, which transforms a received operating voltage into a working voltage. The working voltage is supplied to the flash memory and all elements in the control chip, inclusive of the core controller and the output circuit. That is, the voltage regulator in the third type of memory card has to supply working voltages for all of elements in the memory card, so the supplied current is relatively high. However, in view of the high-pressure process, the higher the instantaneous maximum current required, the larger the insulating layer needed. Therefore, in order to provide enough current, the area of the voltage regulator is greatly enlarged, and the cost of the control chip is increased.

SUMMARY OF THE INVENTION

A control chip in accordance with the present invention capable of supporting various voltage supplies in a memory card, which comprises a flash memory. The control chip controls the flash memory and includes a voltage regulator, a pad power supplier, a core controller and an output circuit. The voltage regulator receives an external working voltage and transforms the external working voltage into a working voltage. The pad power supplier receives the external working voltage and adjusts a level of the external working voltage to output a pad working voltage according to an operating mode. The core controller receives the working voltage to work and generates a control signal. The output circuit receives the control signal and outputs a to memory control signal according to a level of the pad working voltage. The control chip controls the flash memory with the memory control signal.

In accordance with another aspect of the present invention, a voltage supplying method of supporting multiple voltages in a control chip is provided. The method includes the steps of: receiving an external working voltage and transforming the external working voltage into a working voltage; generating a control signal according to the working voltage; receiving the external working voltage and adjusting a level of the external working voltage to output a pad working voltage according to an operating mode; and outputting a memory control signal to control a flash memory according to the control signal and a level of the pad working voltage.

In accordance with still another aspect of the present invention, a memory card capable of supporting various voltage supplies comprises a flash memory and a control chip. The control chip controls the flash memory and includes a voltage regulator, a pad power supplier a core controller and an output circuit. The voltage regulator receives an external working voltage and transforms the external working voltage into a working voltage. The pad power supplier receives the external working voltage and adjusts a level of the external working voltage to output a pad working voltage according to an operating mode. The core controller receives the working voltage to work and generates a control signal. The output circuit receives the control signal and outputs a memory control signal according to a level of the pad working voltage. The control chip controls the flash memory with the memory control signal.

Other objects, features, and advantages of the invention will become apparent from the following detailed description

DETAILED DESCRIPTION OF THE INVENTION

Figure 1:
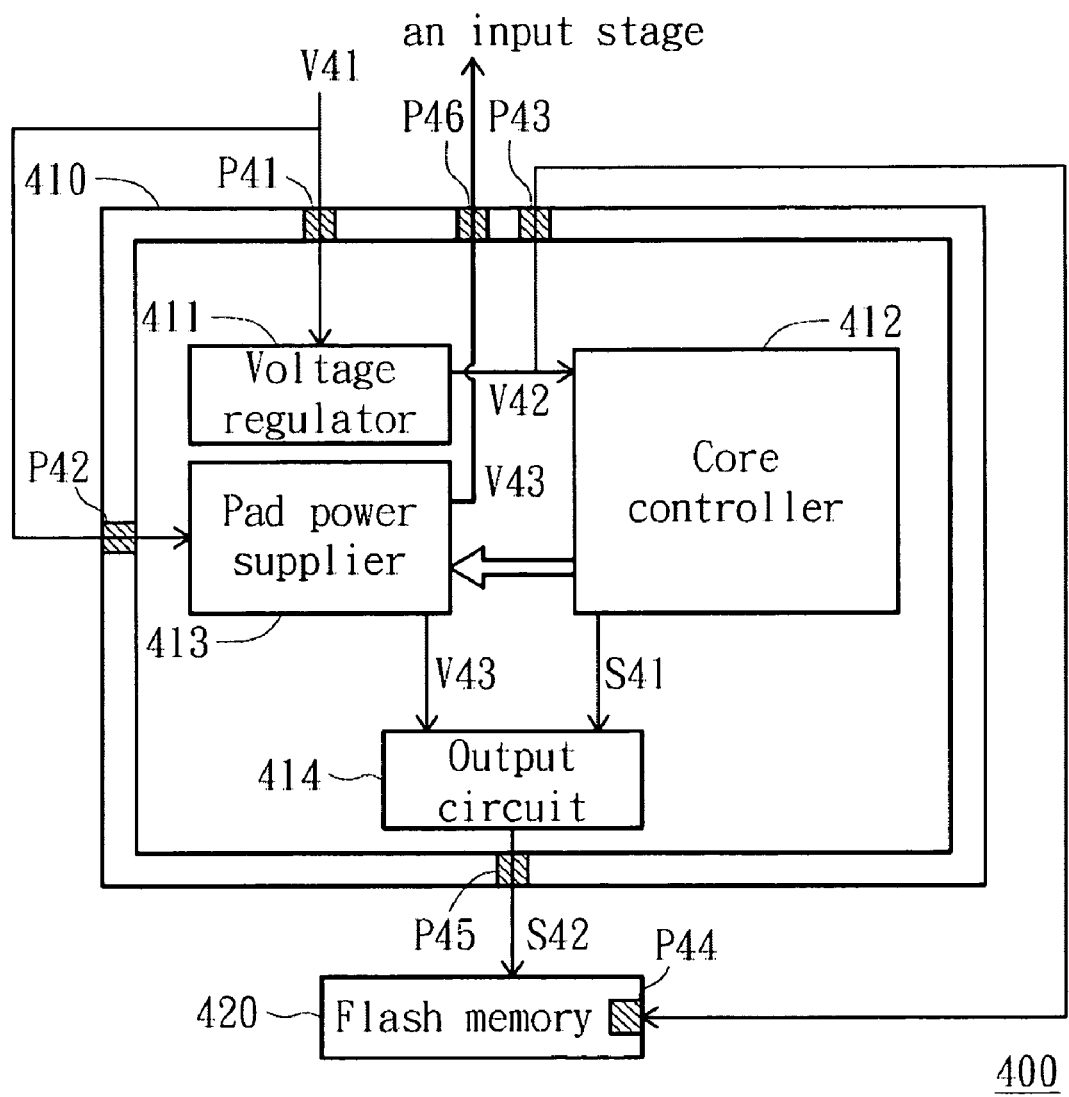
FIG. 1 shows a power architecture of a memory card according to a preferred embodiment of the invention.

FIG. 1 shows the power architecture of a memory card 400 according to a preferred embodiment of the invention. Referring to FIG. 1, the memory card 400 includes a control chip 410 and a flash memory 420. The control chip 410 controls the flash memory 420. The flash memory 420 stores data. The control chip 410 includes a voltage regulator 411, a core controller 412, a pad power supplier 413 and an output circuit 414. In use, the memory card 400 receives a working voltage V41 of, for example, 3.3 or 1.8 volts, which is outputted from a host, to work. The working voltage V41 is outputted to the voltage regulator 411 through a pad P41, and then transmitted to the pad power supplier 413 through a pad P42. The voltage regulator 411 outputs a first working voltage V42 to the core controller 412 according to the working voltage V41, and the first working voltage V42 of, for example, 1.8 volts is transmitted to the flash memory 420 through pads P43 ad P44. The core controller 412 works according to the first working voltage V42 and outputs a control signal S41. The pad power supplier 413 outputs a second working voltage V43 according to the working voltage V41. The output circuit 414 outputs, through a pad P45, a control signal S42 to the flash memory 420 to control the flash memory 420 according to the control signal S41 and the second working voltage V43.

In the concept of the invention, the memory card has two power supplying portions. In the first power supplying portion, the voltage regulator 411 receives the working voltage V41 and outputs the first working voltage V42 to the core controller 412 and the flash memory 420. In the second power supplying portion, the pad power supplier 413 receives the working voltage V41 and supplies the voltage for multiple pads of the control chip 410, such as the voltage required by an output stage or an input stage. For example, the pad power supplier 413 supplies the second working voltage V43 for the pad P45 via the output circuit 414, which is further provided to the flash memory 420 at the output stage. The pad power supplier 413 further supplies the second working voltage V43 to an input stage via a pad P46 of the control chip 410, as shown in FIG. 1. Therefore, the pad power supplier 413 has to provide a relatively large current, so providing the power to the pad power supplier in an independent manner is preferred. However, because the working voltage V41 is provided by an external source, the voltage value thereof is uncertain, the pad power supplier 413 in this embodiment has to receive different working voltages provided by the host.

Please refer to FIG. 1 again, in this embodiment, the pad power supplier 413 outputs the second working voltage V43, and the output circuit 414 outputs a control signal S42 to control the flash memory 420 according to the level of the second working voltage V43 in conjunction with the control signal S41. The second working voltage V43 is the voltage level required when the control chip 410 and the flash memory 420 communicate with each other. The pad power supplier 413 has three operating modes, which are operated by the core controller 412. Specifically, the core controller 412 can detect the voltage level of the working voltage V41, obtain the working voltage of the flash memory 420 through the internal setting, and adjust the operating modes of the pad power supplier 413 based on the working voltage V41 and the working voltage of the flash memory 420, in a way well-known in the art. In the preferred embodiment, if the core controller 412 detects that the working voltage V41 is 3.3 volts, the flash memory 420 is of the type of 3.3 volts, and the working voltage V43 is 3.3 volts, then the pad power supplier 413 is adjusted in a first operating mode. At this time, the pad power supplier 413 directly outputs the working voltage V41 as the second working voltage V43 and thus supports the single voltage mode. If the core controller 412 detects that the working voltage 141 is 3.3 volts, the flash memory 420 is of the type of 1.8 volts, and the second working voltage V43 is 1.8 volts, then the pad power supplier 413 is adjusted in a second operating mode. At this time the pad power supplier 413 drops the working voltage V41 and then outputs the second working voltage V43, and is thus capable of supporting high voltages of two voltage modes. If the core controller 412 detects that the working voltage V41 is 1.8 volts, the flash memory 420 is of the type of 1.8 volts, and the second working voltage V43 is 1.8 volts, then the pad power supplier 413 is adjusted in a third operating mode. At this time, the pad power supplier 413 directly outputs the working voltage V41 as the second working voltage V43, and is thus capable of supporting low voltages of two voltage modes.

It is understandable that the working voltage V41 and the working voltage of the flash memory 420 can be at any voltage level, so the levels of the second working voltage V43 in the three operating modes are various according to specific application, but not limited in 1.8 or 3.3 volts. Therefore, the memory card 400 in accordance with the present invention can automatically configure itself to operate at the power supply voltage to which the memory card is currently connected.

The pad power supplier 413 itself is formed by way of high-pressure processes, so the area thereof is originally very large. In this embodiment, the voltage is dropped by way of MOS (Metal Oxide Semiconductor) in the pad power supplier 413. The core controller 412 detects the voltage level V41 supplied by the host and obtains the working voltage of the flash memory 420 through the internal setting so as to adjust the circuit in the pad power supplier 413 and thus to achieve the object of the usage in various operating modes.

It can be seen that the memory card and the voltage supplying method according to the embodiments of the invention can work under different power supply voltages, and no additional voltage regulator has to be added due to the supporting of two voltages. Moreover, the area of the build-in voltage regulator does not have to be greatly enlarged in order to supply a high current. Thus, the manufacturing cost of the memory card can be reduced.

While the invention has been described by way of example and in terms of a preferred embodiment, it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A memory card capable of supporting various voltage supplies, the memory card comprising:
    a flash memory; and
    a control chip for controlling the flash memory, the control chip comprising:

a voltage regulator for receiving an external working voltage and transforming the external working voltage into a working voltage;

a pad power supplier for receiving the external working voltage and adjusting a level of the external working voltage to output a pad working voltage according to an operating mode, wherein the pad power supplier supplies the pad working voltage to at least an input stage and an output stage of the control chip through multiple pads of the control chip;

a core controller for receiving the working voltage to work and generating a control signal; and an output circuit for receiving the control signal and outputting a memory control signal according to a level of the pad working voltage, wherein the control chip controls the flash memory with the memory control signal.

2. The memory card according to claim 1, wherein the external working voltage is 3.3 volts or 1.8 volts.

3. The memory card according to claim 1, wherein the pad working voltage is 3.3 volts or 1.8 volts.

4. The memory card according to claim 1, wherein the voltage regulator receives the external working voltage through a pad of the control chip.

5. The memory card according to claim 1, wherein the pad power supplier receives the external working voltage through a pad of the control chip.

6. The memory card according to claim 1, wherein the voltage regulator outputs the working voltage through a first pad on the control chip, and the flash memory receives the working voltage through a second pad of the flash memory.

7. The memory card according to claim 1, wherein the output circuit outputs the memory control signal to the flash memory through a pad of the control chip.

8. A control chip for a flash memory, comprising:

a voltage regulator for receiving an external working voltage and transforming the external working voltage into a working voltage;

a pad power supplier for receiving the external working voltage and adjusting a level of the external working voltage to output a pad working voltage according to an operating mode, wherein the pad power supplier supplies the pad working voltage to at least an input stage and an output stage of the control chip through multiple pads of the control chip;

a core controller for receiving the working voltage to work and generating a control signal; and an output circuit for receiving the control signal and outputting a memory control signal according to a level of the pad working voltage, wherein the control chip controls the flash memory with the memory control signal.

9. The control chip according to claim 8, wherein the external working voltage is 3.3 volts or 1.8 volts.

10. The control chip according to claim 8, wherein the pad working voltage is 3.3 volts or 1.8 volts.

11. The control chip according to claim 8, wherein the voltage regulator receives the external working voltage through a pad of the control chip.

12. The control chip according to claim 8, wherein the pad power supplier receives the external working voltage through a pad of the control chip.

13. The control chip according to claim 8, wherein the voltage regulator outputs the working voltage through a first pad of the control chip, and the flash memory receives the working voltage through a second pad of the flash memory.

14. The control chip according to claim 8, wherein the output circuit outputs the memory control signal to the flash memory through a pad on the control chip.

15. A voltage supplying method for a control chip, comprising:

receiving an external working voltage and transforming the external working voltage into a working voltage;

generating a control signal according to the working voltage;

receiving the external working voltage and adjusting a level of the external working voltage to output a pad working voltage according to an operating mode and supply the pad working voltage to at least an input stage and an output stage of the control chip through multiple pads of the control chip; and outputting a memory control signal to control a flash memory according to the control signal and a level of the pad working voltage.

16. The method according to claim 15, wherein the external working voltage is 3.3 volts or 1.8 volts.

17. The method according to claim 15, wherein the pad working voltage is 3.3 volts or 1.8 volts.

18. The method according to claim 15, wherein the control chip receives the external working voltage through a pad of the control chip.

19. The method according to claim 15, wherein the control chip outputs the working voltage through a first pad of the control chip, and the flash memory receives the working voltage through a second pad of the flash memory.

20. The method according to claim 15, wherein the control chip further comprises a pad, through which the control chip outputs the memory control signal to the flash memory.

* * * * *